US008761707B1

(12) United States Patent
Connell et al.

(10) Patent No.: US 8,761,707 B1
(45) Date of Patent: Jun. 24, 2014

(54) RADIO FREQUENCY LOW NOISE AMPLIFIER LOAD CIRCUIT

(71) Applicant: Futurewei Technologies, Inc., Plano, TX (US)

(72) Inventors: Lawrence Connell, Naperville, IL (US); William Roeckner, Carpentersville, IL (US); Terrie McCain, Round Lake, IL (US); Matthew Miller, Arlington Heights, IL (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 13/793,033

(22) Filed: Mar. 11, 2013

(51) Int. Cl.
*H04B 1/18* (2006.01)
*H02M 11/00* (2006.01)
*H03F 3/193* (2006.01)
*H04B 1/16* (2006.01)

(52) U.S. Cl.
CPC . *H03F 3/193* (2013.01); *H04B 1/16* (2013.01)
USPC .............................. 455/293; 455/341; 327/103

(58) Field of Classification Search
USPC .......... 455/280, 293, 341; 330/252, 253, 258, 330/261; 327/103; 363/73
See application file for complete search history.

(56) References Cited

U.S. PATENT DOCUMENTS

| 2008/0231362 | A1* | 9/2008 | Muthali et al. | 330/253 |
| 2009/0258624 | A1* | 10/2009 | Gudem et al. | 455/234.1 |
| 2010/0109781 | A1* | 5/2010 | Deguchi et al. | 330/296 |

OTHER PUBLICATIONS

Kaczman, D., et al., "A Single-Chip 10-Band WCDMA/HSDPA 4-Band GSM/Edge Saw-less CMOS Receiver With DigRF 3G Interface and +90 dBm IIP2", IEEE Journal of Solid-State Circuits, vol. 44, No. 3, Mar. 2009, pp. 718-739.

* cited by examiner

*Primary Examiner* — Nguyen Vo
(74) *Attorney, Agent, or Firm* — Conley Rose, P.C.; Grant Rodolph; Nicholas K. Beaulieu

(57) ABSTRACT

A circuit comprising a transconductor amplifier, and a load connected to the transconductor amplifier, wherein the load comprises a load transistor that is passively biased.

19 Claims, 4 Drawing Sheets

US 8,761,707 B1

RADIO FREQUENCY LOW NOISE AMPLIFIER LOAD CIRCUIT

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Analog front-end receivers may be used in many wireless communication applications and devices, including cellular, Wi-Fi, and Bluetooth applications and devices. One component of analog front-end receivers may be an amplifier (sometimes referred to as a low noise amplifier or LNA). LNAs present many design challenges, especially in cellular transceivers where the gain is adjustable or programmable. For example, it may be desirable for a LNA to have a high gain in order to produce a low noise figure (NF). Further, for high gain transconductance LNAs, a high impedance load circuit may be desirable while the LNA operates at a sufficiently high output common mode voltage.

SUMMARY

In one embodiment, the disclosure includes a circuit comprising a transconductor amplifier, and a load connected to the transconductor amplifier, wherein the load comprises a load transistor that is passively biased.

In another embodiment, the disclosure includes a wireless receiver comprising an antenna, a mixer, and an amplifier circuit connected between the antenna and the mixer, wherein the amplifier circuit comprises a transconductor amplifier, and a load coupled to the transconductor amplifier, wherein the load comprises a load transistor that is passively biased.

In yet another embodiment, the disclosure includes a method comprising receiving a differential radio frequency (RF) voltage signal at an input, and converting the voltage signal to a differential RF current signal, by a transconductor amplifier, wherein the transconductor amplifier is connected to a load, and wherein the load comprises a load transistor and a resistor directly connected to the gate and the drain of the load transistor.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein is a transconductor amplifier coupled to a load circuit capable of high impedance while operating with a sufficiently high output common mode voltage. The load circuit may constitute part of an amplifier circuit in a wireless transceiver. The amplifier circuit may be a high gain transconductor amplifier useful in wireless communication systems. The load circuit may employ a low-complexity, passive biasing of active load devices in order to maximize output load impedance (and thus gain) for a given desired minimum output common mode voltage.

Figure 1:
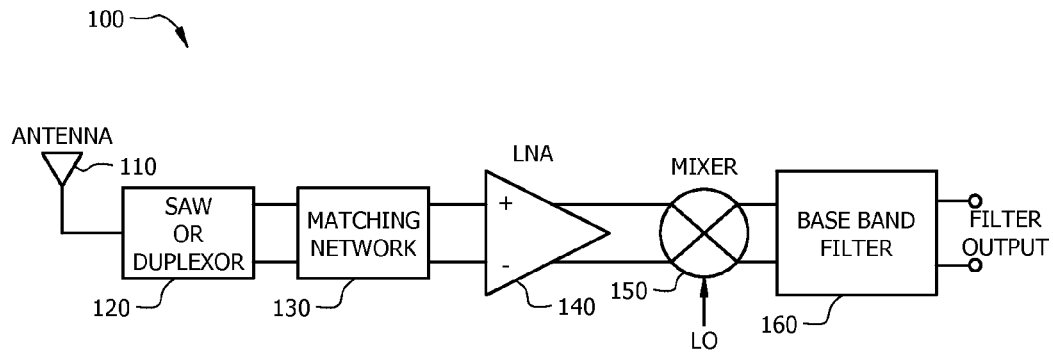
FIG. 1 is a schematic diagram of an embodiment of a receiver.

FIG. 1 is a schematic diagram of an embodiment of a receiver 100. The receiver 100 may be used as part of a wireless communication device, such as a cell phone, smart phone, or tablet computer. The receiver 100 comprises an antenna 110, a surface acoustic wave (SAW) filter or duplexer 120, a matching network 130, a LNA 140, a radio frequency (RF) mixer 150, and a base band filter 160 configured as shown in FIG. 1. The antenna 110 may be configured to receive a RF signal and produce a signal as an input to the SAW filter or duplexer 120. The SAW filter or duplexer 120 and matching network 130 may perform filtering and impedance matching, respectively. The LNA 140 may comprise a differential transconductor amplifier configured to receive a differential voltage from the matching network 130 and configured to generate a differential current from the differential voltage to provide as an input to the mixer 150. The mixer 150 may convert a relatively high-frequency RF input signal to a lower or intermediate frequency (IF) signal or base band signal for subsequent processing. The mixer 150 may be coupled to a differential local oscillator (LO) at a given frequency to help perform the described frequency conversion. In the receiver 100, the mixer 150 is followed by a base band filter 160 that provides a signal for baseband processing. As a person of ordinary skill in the art will recognize, the receiver 100 is but one possible configuration or embodiment in which a LNA, such as LNA 140, may be used.

Figure 2:
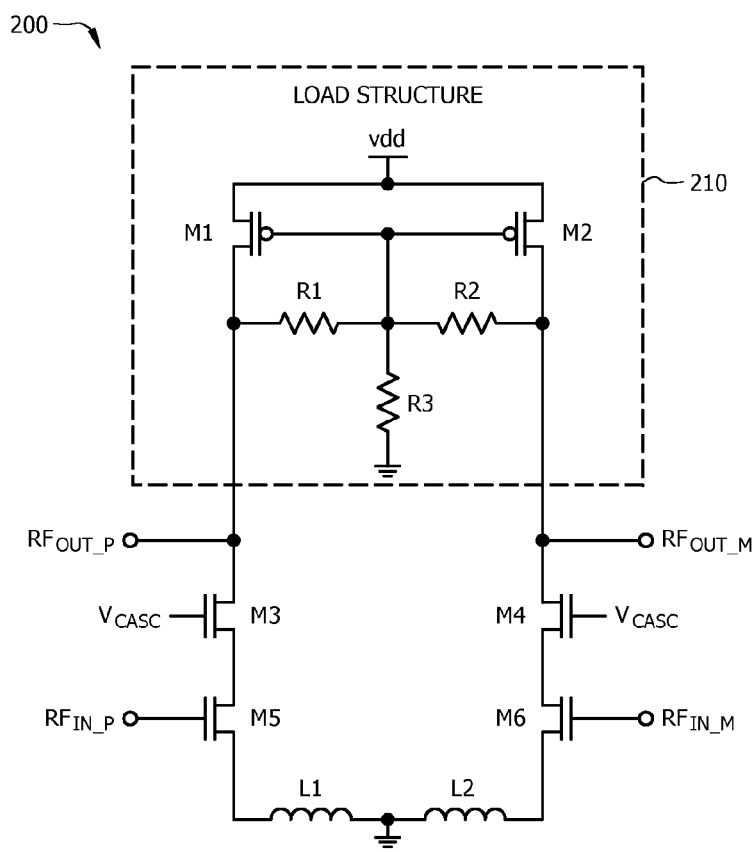
FIG. 2 is a schematic diagram of an embodiment of an amplifier circuit.

FIG. 2 is a schematic diagram of an embodiment of an amplifier circuit 200. The amplifier circuit 200 may form part of a LNA, such as LNA 140. The amplifier circuit 200 comprises n-type metal oxide semiconductor (NMOS) transistors M3-M6, inductors L1 and L2, and load structure or circuit 210 configured as shown in FIG. 2. The amplifier circuit 200 is configured to receive a differential RF input, labeled as $RF_{IN\_P}$ and $RF_{IN\_M}$ for "plus" and "minus" inputs, respectively, in FIG. 2, as shown. The amplifier circuit 200 is configured to generate a differential RF output, labeled as $RF_{OUT\_P}$ and $RF_{OUT\_P}$ for "plus" and "minus" outputs, respectively, in FIG. 2, as shown. Transistors M3-M6 may have programmable gain values so that the amplifier circuit 200 may be used in an adaptive gain control (AGC) stage, for example. The amplifier circuit 200 therefore may have a programmable gain.

The amplifier circuit 200 may act as a transconductor stage that converts a differential RF input voltage to a differential RF output current. The transistors M5 and M6 convert input voltage to current. The load circuit 210 has a high impedance so that most of the current generated in transistors M5 and M6 is transferred to the output and very little goes to the load circuit 210. Transistors M3 and M4 are cascoded transistors that provide a high impedance looking into the output of these transistors. $V_{CASC}$ is a fixed DC voltage used for DC biasing cascode transistors M3 and M4.

The load circuit 210 comprises p-type MOS (PMOS) transistors M1 and M2 as well as resistors R1 and R2 configured as shown in FIG. 2. Resistor R3 is optional, but if used is configured as shown. Although R3 is illustrated as connected to ground, R3 may instead be connected to a non-zero voltage potential. vdd is a DC source voltage. Transistors M1 and M2 may be viewed as active load devices. The active loads M1 and M2 are passively biased with resistors R1 and R2 (and R3 if it exists) as shown. For example, the resistor R1 may be directly connected to the gate and the drain of M1. The impedance of the load circuit 210 may be determined at least in part by the small signal resistance between the drain and source of M1 and M2. Resistors R1 and R2 may sense an output direct current (DC) common mode voltage. Resistor R3 may provide an offset voltage between the gate bias and the output DC common mode voltage. Optimizing the relative values of R1, R2, and R3 allows a maximum load impedance for a given desired output common mode voltage. In one embodiment, R1 is equal to R2. In one embodiment, the amplifier circuit 200 has components with the following values, which provide high gain and low noise: L1=L2=0.5 nanohenries (nH), R1=R2=60 kiloohms (kΩ), R3=120 kΩ, the widths and lengths of M3-M6 may be 300 micrometers (microns) and 0.1 microns, respectively, and the widths and lengths of M1 and M2 150 microns and 0.25 microns, respectively.

Transistors M5 and M6 together with cascoded transistors M3 and M4 and inductors L1 and L2 may be said to form a differential transconductor amplifier that converts a small RF input voltage signal to a large RF output current signal. The amplifier circuit 200 may achieve high impedance at the RF output.

As a person of ordinary skill in the art will recognize, transistors M1 and M2 may instead be NMOS transistors and transistors M3-M6 may instead be PMOS transistors. If this is the case, what is currently labeled as in FIG. 2 as ground may instead be the source voltage vdd and what is currently labeled as in FIG. 2 as vdd may instead be ground. Further, the amplifier circuit 200 is a double-ended or differential circuit. As a person of ordinary skill in the art will recognize, a single-ended circuit can be formed by removing components M2, R2, M4, M6, and L2. A single-ended circuit may receive a single input and produce a single output.

Figure 3:
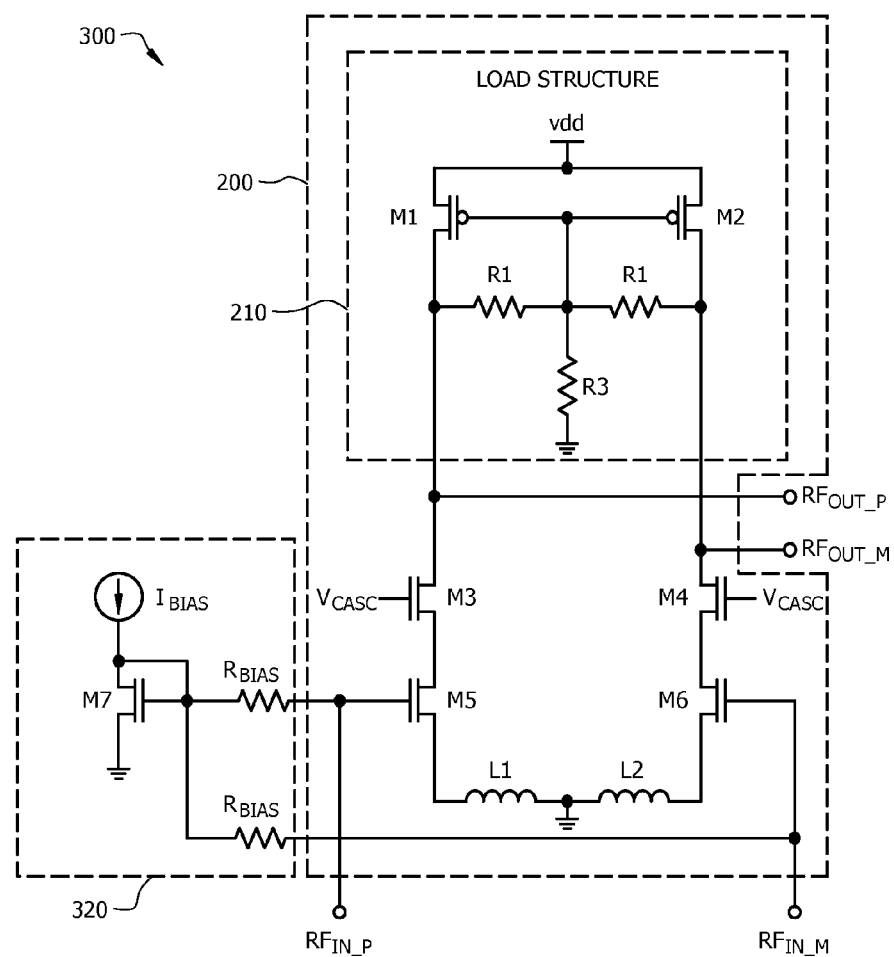
FIG. 3 is a schematic diagram of an embodiment of an amplifier circuit with a direct current (DC) bias circuit.

FIG. 3 is a schematic diagram of the amplifier circuit 200 with a DC bias circuit 320. The system 300 comprises the amplifier circuit 200 and the DC bias circuit 320 configured as shown in FIG. 3. In the interest of conciseness, the amplifier circuit 200 is not described again. The DC bias circuit 320 comprises current source $I_{BIAS}$, transistor M7, and resistors $R_{BIAS}$ configured as shown in FIG. 3. Current source $I_{BIAS}$, transistor M7, and resistors $R_{BIAS}$ are used to provide DC current biasing of the amplifier circuit 200. The connections of M7, M5, and M6 form a current mirror that may set the drain current of M5 and M6 to a scaled value of the drain current in M7 ($I_{BIAS}$). The resistors $R_{BIAS}$ may be used to provide RF isolation for the RF input signal. A LNA, such as LNA 140, may comprise the system 300.

Figure 4:
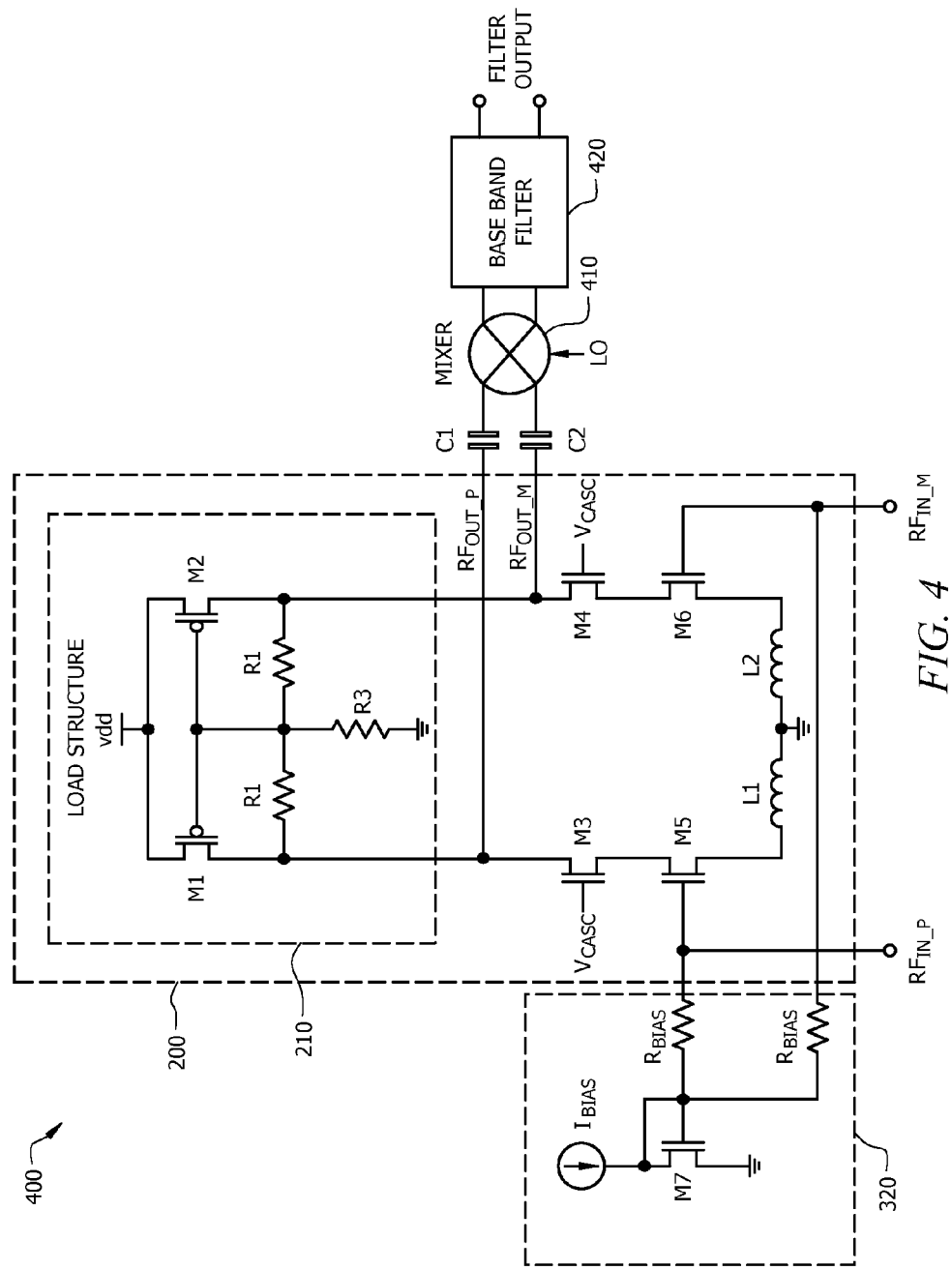
FIG. 4 is a schematic diagram of a system that employs an LNA circuit.

FIG. 4 is a schematic diagram of a system 400 that employs the amplifier circuit 200. The system 400 comprises amplifier circuit 200, DC bias circuit 320, capacitors C1 and C2, RF mixer 410, and base band filter 420 configured as shown in FIG. 4. Amplifier circuit 200 and DC bias circuit 320 were described previously and thus there is no need to describe those circuits again. Capacitors C1 and C2 may be DC blocking capacitors that isolate the DC bias of the amplifier circuit 200 from the DC bias of the mixer As discussed previously, transistors M5 and M6 along with cascoded transistors M3 and M4 (along with inductors L1 and L2) may form a differential transconductor amplifier that converts a small RF input voltage signal into a large RF output current signal. For maximum gain, it is desirable to maximize the RF output current signal that goes to the mixer 410 and subsequently the filter 420. This requires the impedance looking into the mixer 410/filter 420 be much smaller than the impedance of the load circuit 210. Therefore, for high gain a high load impedance and small mixer/filter input impedance is desired. The load circuit 210 achieves a high load impedance.

Disclosed herein are low-complexity apparatuses to optimally bias active load devices of a RF LNA for maximum load impedance while maintaining a minimum desired common mode output voltage, resulting in higher amplifier gain, improved receiver noise figure, and lower cost than other approaches. These benefits may be accomplished through the utilization of resistors R1, R2, and R3, as shown in FIGS. 2-4, for providing simple optimum biasing of active load devices (e.g., M1 and M2). In contrast, one alternative approach may be to insert an operational amplifier (op-amp) between the junction of R1 and R2 and the gates of M1 and M2. However, such a configuration results in excess overhead, complexity, and size, and the configuration may suffer from increased noise and reduced frequency stability.

Figure 5:
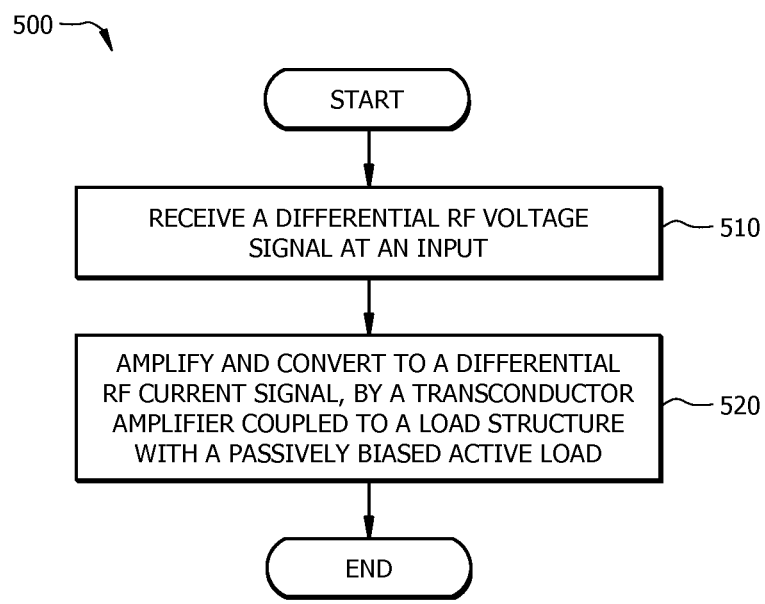
FIG. 5 is a flowchart of an embodiment of a method for amplifying a signal.

FIG. 5 is a flowchart 500 of an embodiment of a method for amplifying a signal. In block 510, a differential RF voltage signal may be received at an input. For example, a differential RF voltage signal may be received at the input to the amplifier circuit 200. The differential RF voltage signal may be a signal obtained via an antenna, such as antenna 110 in FIG. 1, and processed through various intermediate stages (e.g., see FIG. 1) to produce the differential RF voltage signal. Next in block 520, the differential RF voltage signal may be amplified and converted to a differential RF current signal. The amplification and conversion may be performed by a transconductor amplifier coupled to a load structure with an active load that is passively biased. The load structure or circuit 210 is one such load, which comprises two FETs M1 and M2 that are biased by passive elements R1, R2, and R3; and the components M3-M6, L1, and L2 configured as shown in FIG. 2 may be considered as a transconductor amplifier. The differential RF current may be provided to an RF mixer via capacitive coupling as shown in FIG. 4.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. The use of the term "about" means+/−10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A circuit comprising:
   a transconductor amplifier; and
   a load connected to the transconductor amplifier,
   wherein the load comprises a load transistor and two resistors,
   wherein a first one of the two resistors is connected to a gate and a drain of the load transistor, and
   wherein a second one of the two resistors is connected to the gate of the load transistor and a ground.

2. The circuit of claim 1, wherein the transconductor amplifier is a differential amplifier comprising two parallel branches, and wherein the load comprises two parallel branches.

3. The circuit of claim 2, wherein the two parallel branches of the differential amplifier comprise a first amplifier branch and a second amplifier branch, wherein the first amplifier branch comprises a first transistor, a second transistor, and a first inductor, and wherein the first transistor, the second transistor, and the first inductor are connected in series.

4. The circuit of claim 1, wherein the transconductor amplifier is a single-ended amplifier, and wherein the load transistor is connected in series with the transconductor amplifier.

5. The circuit of claim 1, wherein the transconductor amplifier comprises a first transistor and a second transistor, and wherein the circuit further comprises a direct current (DC) bias circuit comprising:
   a bias transistor;
   a current source coupled to the bias transistor; and
   a first resistor connected in series between the gate of the first transistor and the gate of the bias transistor.

6. A wireless receiver comprising:
   an antenna;
   a mixer; and
   an amplifier circuit connected between the antenna and the mixer,
   wherein the amplifier circuit comprises a transconductor amplifier and a load coupled to the transconductor amplifier,
   wherein the load comprises a load transistor and two resistors,
   wherein a first one of the two resistors is connected to a gate and a drain of the load transistor, and
   wherein a second one of the two resistors is connected to the gate of the load transistor and a ground.

7. The wireless receiver of claim 6, wherein the transconductor amplifier is a differential amplifier comprising two parallel branches, and wherein the load comprises two parallel branches.

8. The wireless receiver of claim 7, wherein the two parallel branches of the differential amplifier comprise a first amplifier branch and a second amplifier branch, wherein the first amplifier branch comprises a first transistor, a second transistor, and a first inductor, and wherein the first transistor, the second transistor, and the first inductor are connected in series.

9. The wireless receiver of claim 6, wherein the transconductor amplifier is a single-ended amplifier, and wherein the load transistor is connected in series with the transconductor amplifier.

10. The wireless receiver of claim 6, wherein the amplifier circuit is capacitively coupled to the mixer.

11. The wireless receiver of claim 10, wherein the transconductor amplifier is configured to:
    receive a radio frequency (RF) voltage signal; and
    provide a RF current signal to the mixer based on the RF voltage signal.

12. A method comprising:
    receiving a differential radio frequency (RF) voltage signal at an input; and
    converting the voltage signal to a differential RF current signal, by a transconductor amplifier,
    wherein the transconductor amplifier is connected to a load,
    wherein the load comprises a load transistor and two resistors, wherein a first one of the two resistors is connected to a gate and a drain of the load transistor, and wherein a second one of the two resistors is connected to the gate of the load transistor and a ground.

13. The method of claim 12, wherein the transconductor amplifier is a differential amplifier comprising two parallel branches, and wherein the load comprises two parallel branches.

14. The method of claim 13, further comprising providing the differential RF current signal to a mixer.

15. The method of claim 13, wherein the two parallel branches of the differential amplifier comprise a first amplifier branch and a second amplifier branch, wherein the first amplifier branch comprises a first transistor, a second transistor, and a first inductor, and wherein the first transistor, the second transistor, and the first inductor are connected in series.

16. A circuit comprising:
a transconductor amplifier; and
a load connected to the transconductor amplifier,
wherein the load comprises two parallel branches,
wherein a first branch of the load comprises a first load transistor that is biased by a first resistor,
wherein a second branch of the load comprises a second load transistor that is biased by a second resistor,
wherein a junction of the first resistor and the second resistor is directly connected to a gate of the first load transistor and a gate of the second load transistor, and
wherein the load comprises a third resistor with a first end directly connected to the junction of the first resistor and the second resistor.

17. The circuit of claim 16, wherein the transconductor amplifier comprises a differential amplifier having two parallel branches.

18. The circuit of claim 16, wherein a second end of the third resistor is connected to a ground.

19. The circuit of claim 16, wherein a second end of the third resistor is connected to a voltage potential.

* * * * *